United States Patent
Joshi et al.

(10) Patent No.: US 10,382,036 B2
(45) Date of Patent: Aug. 13, 2019

(54) HIGH VOLTAGE SWITCH

(71) Applicant: QUALCOMM Incorporated, San Diego, CA (US)

(72) Inventors: Alok Prakash Joshi, Bangalore (IN); Gireesh Rajendran, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 187 days.

(21) Appl. No.: 14/608,643

(22) Filed: Jan. 29, 2015

(65) Prior Publication Data

US 2016/0226488 A1    Aug. 4, 2016

(51) Int. Cl.
*H03K 17/10* (2006.01)
*H03K 17/693* (2006.01)

(52) U.S. Cl.
CPC ......... *H03K 17/693* (2013.01); *H03K 17/102* (2013.01); *H03K 2217/0018* (2013.01)

(58) Field of Classification Search
CPC ....... H03K 17/04123; H03K 17/04206; H03K 17/16; H03K 17/693; H03K 2017/066; H03K 2217/0018
See application file for complete search history.

(56) References Cited

U.S. PATENT DOCUMENTS

| 7,230,354 | B2 * | 6/2007 | Lewis | H02M 5/293 307/125 |
|---|---|---|---|---|
| 7,378,898 | B2 | 5/2008 | Nair | |
| 8,008,963 | B2 * | 8/2011 | Sonehara | H03K 17/04163 327/365 |
| 8,058,922 | B2 | 11/2011 | Cassia | |
| 8,203,234 | B2 | 6/2012 | Lee et al. | |
| 8,249,524 | B2 * | 8/2012 | Darwhekar | H04B 5/0031 343/853 |
| 8,395,435 | B2 | 3/2013 | Cassia et al. | |
| 8,749,297 | B2 | 6/2014 | Sutandi et al. | |
| 2003/0141929 | A1 | 7/2003 | Casper et al. | |
| 2008/0088342 | A1 | 4/2008 | Lee et al. | |
| 2009/0174587 | A1 | 7/2009 | Ogawa et al. | |
| 2013/0009725 | A1 | 1/2013 | Heaney et al. | |
| 2014/0145591 | A1 | 5/2014 | Godyak et al. | |

OTHER PUBLICATIONS

International Search Report—PCT/US2016/014249—ISA/EPO—dated Apr. 20, 2016.
Written Opinion—PCT/US2016/014249—ISA/EPO—dated Apr. 20, 2016.

* cited by examiner

*Primary Examiner* — Lincoln D Donovan
*Assistant Examiner* — Colleen J O Toole
(74) *Attorney, Agent, or Firm* — Haynes and Boone, LLP

(57) ABSTRACT

Disclosed is circuitry for operating a switch which sees high voltage swings across its source, gate, drain, and bulk terminals. The circuitry generates one or more bias voltages in proportion to an input voltage swing. The one or more bias voltages may be used to bias the gate and bulk terminals to provide reliable and improved turn OFF performance in the switch.

14 Claims, 5 Drawing Sheets

US 10,382,036 B2

HIGH VOLTAGE SWITCH

BACKGROUND

Unless otherwise indicated, the foregoing is not admitted to be prior art to the claims recited herein and should not be construed as such.

Radio frequency (RF) circuits typically require high power switching of passive devices for power control, multi-band tuning, and so on. RF applications (e.g., mobile communication devices and the like) often have space constraints that limit the amount of silicon area that is available to the designer.

Operating a switch at high power exposes the switch to high voltage swings across its source, gate, drain, and bulk terminals. High voltage swings present a challenge in maintaining the switch in the OFF state, thus affecting high voltage switching reliability.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
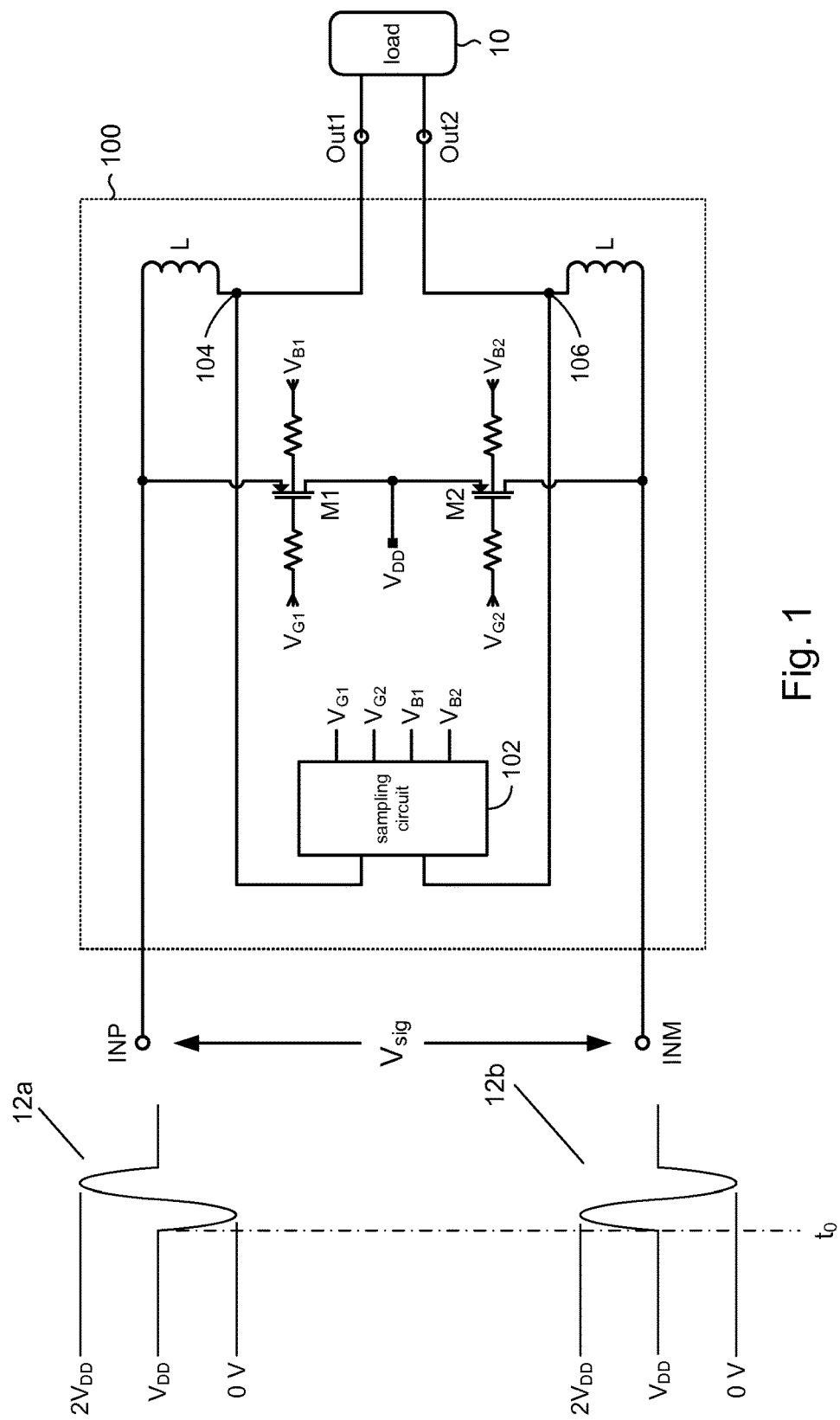
FIG. 1 shows a schematic for a circuit in accordance with the present disclosure.

FIG. 1 shows a high level block diagram of a circuit 100 for driving a load 10 in accordance with the present disclosure. The circuit 100 includes differential input terminals INP and INM, and output terminals OUT1 and OUT2. The figure illustrates an example of input signals 12a, 12b that may be input to the circuit 100. In the example shown, the input signals 12a, 12b are 180° out phase relative to each other. The peak-to-peak voltage swing may be $2V_{DD}$, about a center voltage of $V_{DD}$ and peak voltages of $2V_{DD}$ and 0 volts.

In some embodiments, the circuit 100 may an output circuit comprising first and second transistor devices M1, M2 connected in series. In a particular embodiment, M1 and M2 are field effect transistors (FETs), and in particular PMOS type FET devices. However, it will be appreciated that in other embodiments M1 and M2 may be NMOS devices. Transistors M1 and M2 may be enhancement type transistors or depletion type transistors.

In the embodiment shown in FIG. 1, the source terminal of M1 and the drain terminal of M2 have a common connection to a voltage source $V_{DD}$. The input terminals INP, INM may be connected across transistors M1 and M2. For example, input terminal INP may be connected to the drain terminal of M1 and the input terminal INM may be connected to the source terminal of M2.

The circuit 100 may include first and second inductive elements L to couple the input terminals INP, INM to the output terminals OUT1, OUT2. In the embodiment shown in FIG. 1, for example, each inductive element L may connect an input terminal INP, INM to a respective output terminal OUT1, OUT2.

Figure 1A:
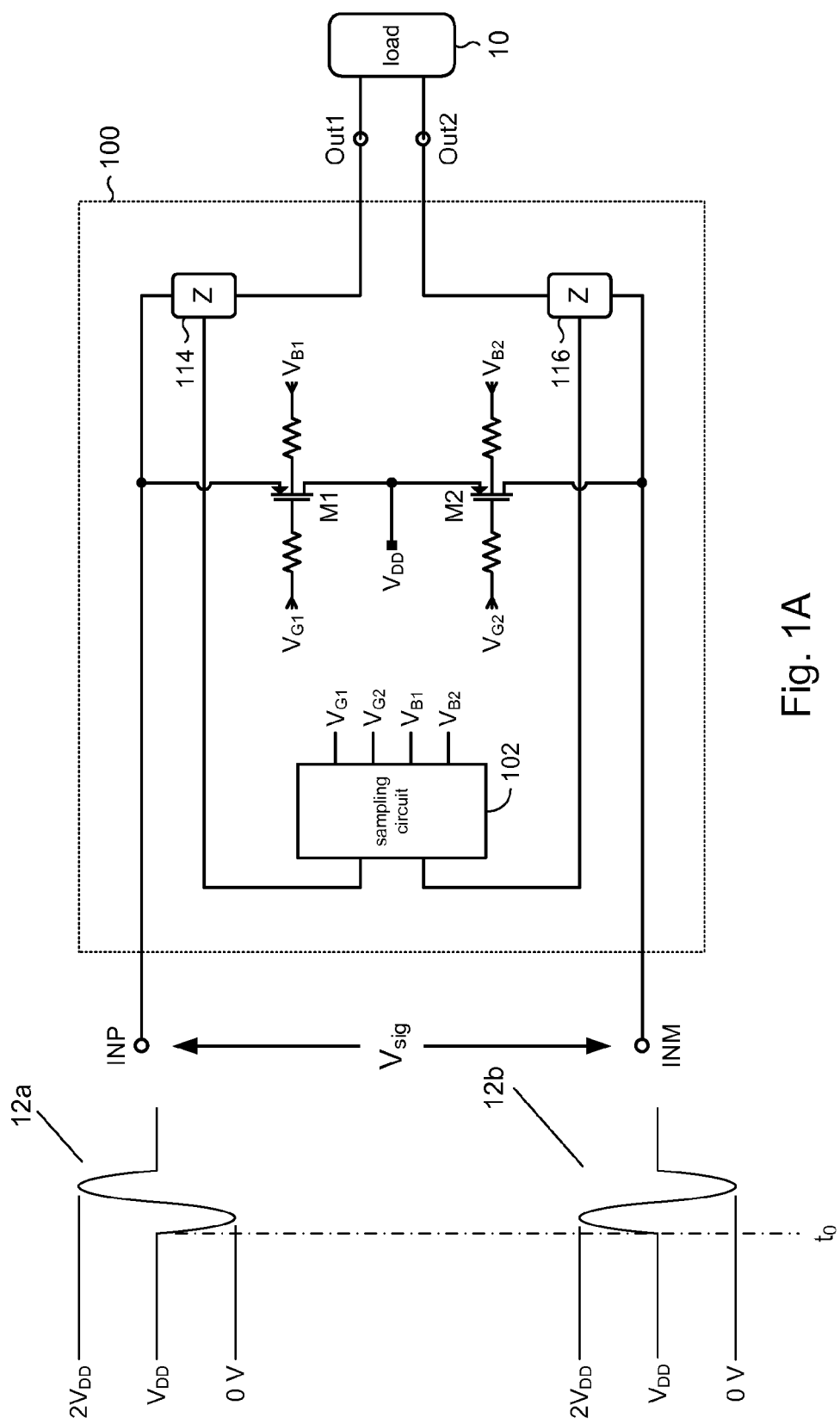
FIG. 1A shows a schematic for an alternative embodiment of a circuit in accordance with the present disclosure.

In accordance with the present disclosure, the circuit 100 may include a sampling circuit 102. Inputs to the sampling circuit 102 may be connected to sense the input signals (e.g., 12a, 12b). Inputs to the sampling circuit 102 may be connected to sense points 104, 106, for example. In accordance with the present disclosure, the sense points 104, 106 may be any connection that allow the sampling circuit 102 to sense the input signals. Referring, for example, to FIG. 1A, in general, the input terminals INP, INM may be coupled to the output by a general network 114, 116, represented in the figure by impedances Z. The sampling circuit 102 may connect its inputs to sense points along signal paths in the network 114, 116 in electrical communication with the input terminals INP, INM.

Returning to FIG. 1, the sampling circuit 102 may produce one or more voltages $V_{G1}$, $V_{G2}$, $V_{B1}$, $V_{B2}$. In some embodiments, the voltages $V_{G1}$, $V_{G2}$, $V_{B1}$, $V_{B2}$ may be the same voltage; i.e., $V_{G1}=V_{G2}=V_{B1}=V_{B2}$. In other embodiments, $V_{G1}$, $V_{G2}$, $V_{B1}$, $V_{B2}$ may be different voltages. In still other embodiments, some of the voltages $V_{G1}$, $V_{G2}$, $V_{B1}$, $V_{B2}$ may be the same and some may be different.

In accordance with the present disclosure, the sampling 102 can generate voltages $V_{G1}$, $V_{G2}$, $V_{B1}$, $V_{B2}$ that are proportional to the voltage swing $V_{sig}$ at the input terminals INP, INM. In some embodiments, the levels of the voltages $V_{G1}$, $V_{G2}$, $V_{B1}$, $V_{B2}$ may be produced in accordance with the following relationship:

$$\text{bias voltage} = \alpha \times V\text{sig} + k,$$

where $\alpha$ is a real constant, k is a real constant, $V_{sig}$ is the voltage swing (e.g., peak-to-peak value) at the input terminals, $V_{DD}$ is a power rail voltage.

In some embodiments, the voltages $V_{G1}$ and $V_{G2}$ may be connected to the gate terminals of M1 and M2, respectively. Further in accordance with some embodiments, the voltages $V_{B1}$ and $V_{B2}$ may be connected to the bulk terminals of M1 and M2, respectively. The term "bulk terminal" can be variously referred to as the body terminal, base terminal, substrate terminal, the "fourth" terminal, and so on.

Figure 2:
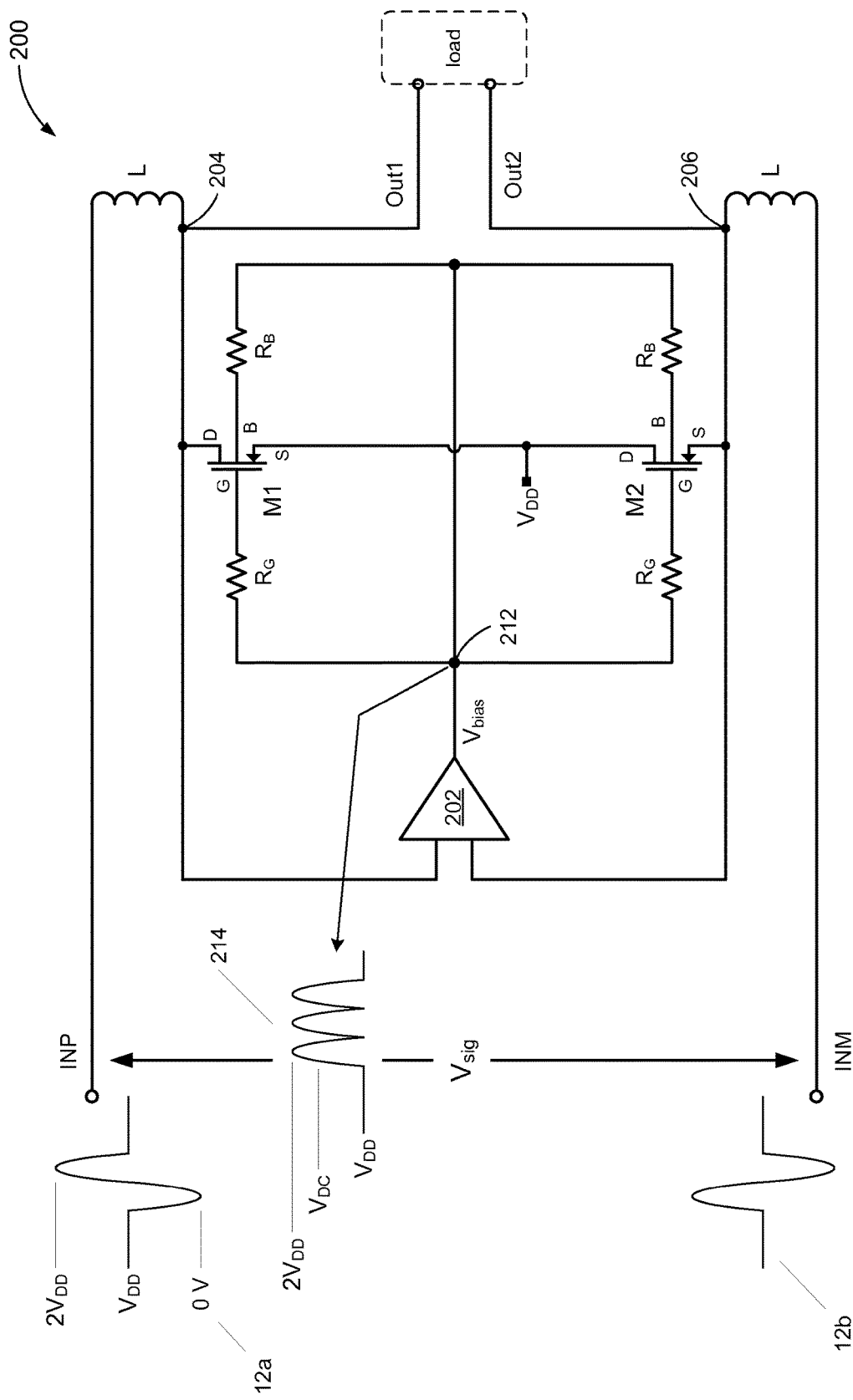
FIG. 2 illustrates an example of a specific embodiments of a circuit of the present disclosure.
Figure 2A:
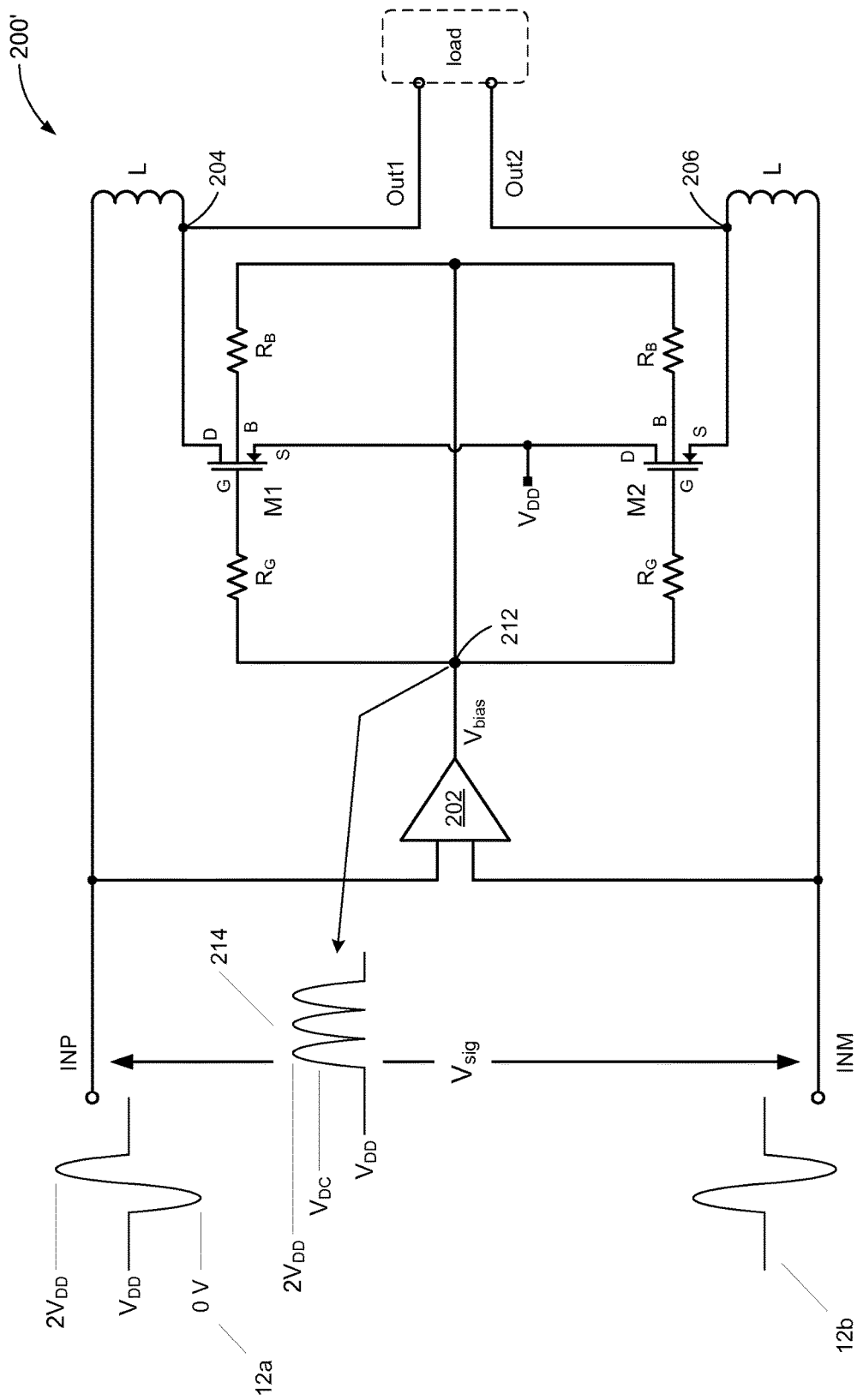
FIG. 2A illustrates an alternative embodiment of the circuit shown in FIG. 2.

Refer now to FIG. 2 for a description of a particular circuit embodiment in accordance with the present disclosure. In the particular embodiment shown in FIG. 2, the circuit 200 includes a sampling circuit 202 that has an output 212 connected to the gate terminals G (via resistors $R_G$) and bulk terminals B (via resistors $R_B$) of transistors M1 and M2. Inputs to the sampling circuit 202 are connected to sense points 204 and 206. FIG. 2A shows an example of a circuit 200' where the inputs of sampling circuit 202 are connected directly to the input terminals INP, INM.

Returning to FIG. 2, in some embodiments, the sampling circuit 202 may be a full wave rectifier circuit. The input signals 12a, 12b can be full-wave rectified by the sampling circuit 202 to produce output waveform 214 shown in FIG. 2. As is known by those of ordinary skill in the art, the equivalent DC level $V_{DC}$ of the output waveform 214 is:

$$V_{DC} = \frac{2V_{peak}}{\pi}.$$

In the embodiment shown in FIG. 2, $V_{peak}=(2V_{DD}-V_{DD})=V_{DD}$. The computed equivalent DC level $V_{DC}$ is therefore $0.64V_{DD}$. However, the output is DC shifted by $V_{DD}$, and so the actual $V_{DC}$ is $(V_{DD}+0.64V_{DD})$.

In accordance with the present disclosure, the output 212 may be provided to the gate terminals G and bulk terminals B of transistors M1, M2 to bias the gate and bulk terminals, for example, using resistors $R_G$ and $R_B$. Accordingly, the gate terminals G and bulk terminals B of transistors M1 and M2 can be biased at a voltage level $(V_{DD}+0.64V_{DD})$. Consequently, for transistor M1, the potential at gate terminal G and the potential at bulk terminal B will always be $0.64V_{DD}$ above the potential at the drain terminal D of M1. This ensures proper reverse biasing of the bulk diode and turn OFF of M1. Similarly, the potential at gate terminal G and the potential at bulk terminal B of transistor M2 will always be $0.64V_{DD}$ above the potential at the source terminal S of M2 to ensure proper reverse biasing of the bulk diode and turn OFF of M2.

Circuits in accordance with the present disclosure ensure reliability as the voltage across any two terminals in the OFF mode is less than $V_{DD}$. Circuits in accordance with the present disclosure require fewer switches than conventional solutions to achieve the same, or better, turn OFF performance. Since the gate and bulk are consistently maintained at a higher voltage level than the source/drain, switches used in circuits according to the present disclosure exhibit better distortion performance in the OFF state than when used in conventional solutions.

As shown in FIG. 2, in some embodiments, the sampling circuit 202 comprises a full wave rectifier. It will be appreciated that in other embodiments, sampling circuit 202 may comprise alternative circuitry. For example, the sampling circuit 202 may comprise a peak detection circuit. In still other embodiments, the sampling circuit may comprise a self-mixing local oscillator design, and so on. The designs of these circuits are known by those of ordinary skill in the art. In some embodiments, depending on where the inputs are sensed, the sampling circuit 202 may include amplification circuitry in order to generate output having a suitable level. Generally, as explained in connection with FIG. 1, the sampling circuit 102 may be operable to provide one or more output voltages that are proportional to the voltage swing at the input terminals.

Figure 3:
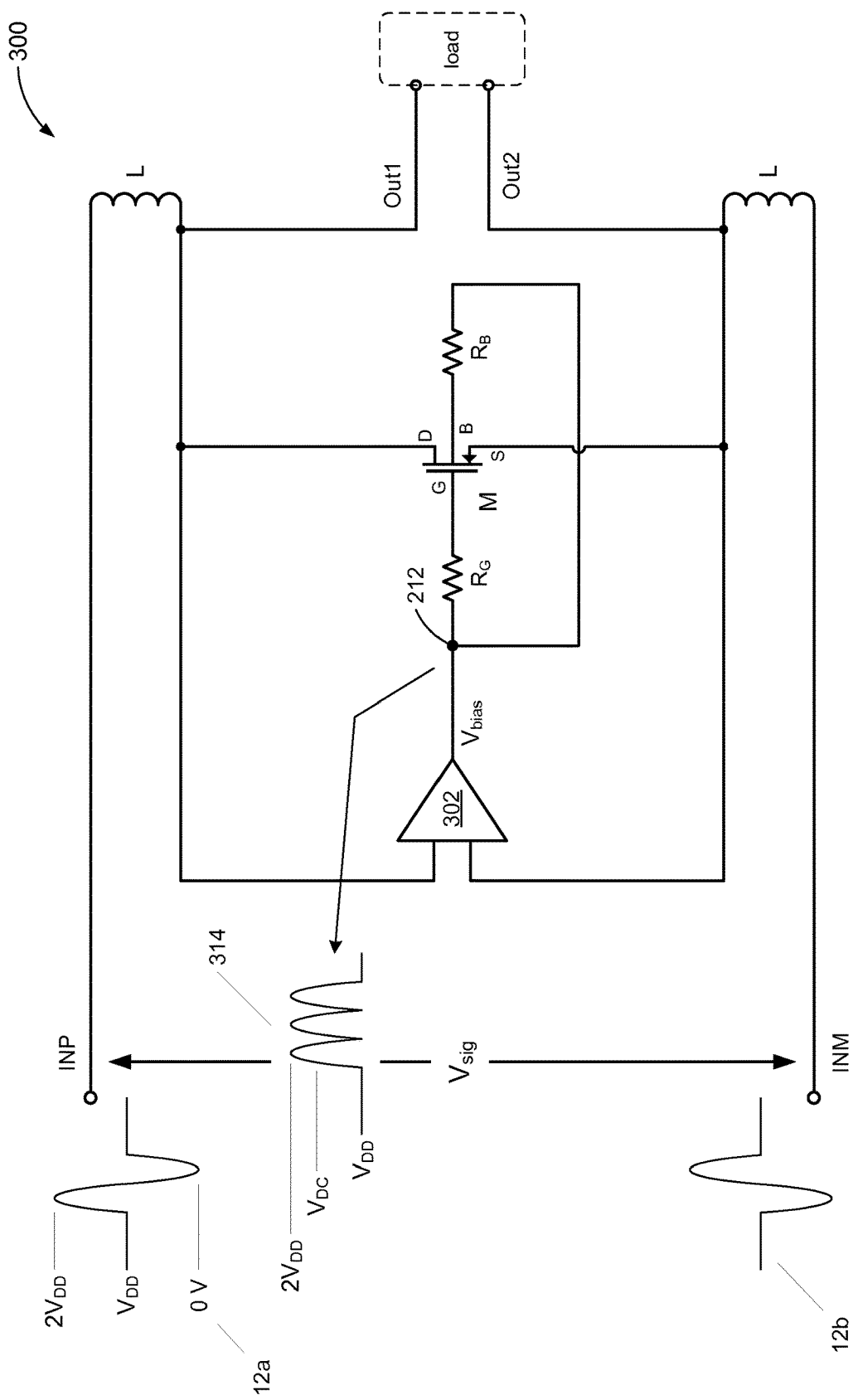
FIG. 3 illustrates an embodiments of an alternative circuit of the present disclosure.

FIG. 3 illustrates another circuit embodiment in accordance with the present disclosure. In some embodiments, a circuit 300 may comprise a single transistor device M. The circuit behavior of circuit 300 is substantially the same as explained in connection with circuit 200 in FIG. 2. The sampling circuit 302 may include a full wave rectifier, a peak detector, a self-mixing local oscillator, and the like. In an embodiment, where sampling circuit 312 comprises a full wave rectifier, the output wave form 314 has an equivalent DC level $V_{DC}$ that can be used to bias the gate terminal G and bulk terminal B of transistor M, as explained above.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. A circuit comprising:
   first and second input terminals for a connection to a source of first and second input voltages, wherein the first and second input voltages are differential in nature;
   an output circuit having output terminals for a connection to a load, the output circuit comprising one or more transistor devices, the one or more transistor devices each having a gate terminal, a source terminal, a drain terminal, and a bulk terminal; and
   a sampling circuit having first and second inputs in electrical connection with the first and second input terminals, the sampling circuit further having one or more outputs, each of the one or more outputs coupled to a gate terminal or a bulk terminal of a transistor device of the one or more transistor devices,
   the sampling circuit operative to generate one or more voltage levels at the one or more outputs thereof responsive to voltage levels at the first and second input terminals, the sampling circuit being configured to maintain the voltage level biasing each of the gate terminal and the bulk terminal of a respective transistor device at voltage levels higher than voltage levels at the source terminal and the drain terminal of the respective transistor device, wherein the sampling circuit comprises a self-mixing local oscillator.

2. The circuit of claim 1 wherein the sampling circuit is further operative to produce a voltage level at the one or more outputs thereof that is proportional to a voltage swing between the first and second input terminals.

3. The circuit of claim 1 wherein the output circuit comprises two transistor devices, wherein the one or more outputs of the sampling circuit comprise four outputs, each of the four outputs coupled to a gate terminal or a bulk terminal of the two transistor devices which is different than a gate terminal or a bulk terminal to which any other output of the four outputs is coupled.

4. The circuit of claim 1 wherein the at least one transistor device is a field effect transistor (FET).

5. A circuit comprising:
   first and second input terminals;
   first and second output terminals;
   a network connected between the input terminals and the output terminals;
   a switching circuit having a source terminal, a drain terminal, at least two gate terminals, and at least two bulk terminals, the first and second input terminals coupled to the source and drain terminals, respectively;
   a sampling circuit having an input in electrical connection with the input terminals, the sampling circuit having an output, the output of the sampling circuit coupled to each of the at least two gate terminals and the at least two bulk terminals of the switching circuit, the sampling circuit operative to generate a voltage level at the output thereof based on input signals at the input terminals, the sampling circuit being configured to maintain the voltage level biasing of each of the at least two gate terminals and the at least two bulk terminals at voltage levels higher than voltage levels at the source terminal and the drain terminal, wherein the sampling circuit comprises a self-mixing local oscillator.

6. The circuit of claim 5 wherein the sampling circuit is operative to generate a voltage level that is proportional to a voltage swing between the first input terminal and the second input terminal.

7. The circuit of claim 5 wherein the sampling circuit is connected to sampling points in the network.

8. The circuit of claim 7 wherein the network comprises a first inductor and a second inductor.

9. The circuit of claim 5 wherein the switching circuit comprises a first transistor device and a second transistor device, a source of the first transistor device connected to a drain of the second transistor device.

10. A circuit comprising:

first and second input terminals;

a switching circuit having a source terminal, a drain terminal, at least two gate terminals, and at least two bulk terminals, the first and second input terminals coupled to the source and drain terminals, respectively; and means for generating a voltage level responsive to a voltage swing at the first and second input terminals, the voltage level being coupled to each of the at least two gate terminals and the at least two bulk terminals, the means for generating is operative to maintain a bias at each of the least two gate terminals and the at least two bulk terminals at voltage levels higher than voltage levels at the source terminal and the drain terminal, wherein the means for generating comprises a self-mixing local oscillator.

11. The circuit of claim 10 wherein the switching circuit comprises a first transistor device and a second transistor device, a source of the first transistor device connected to a drain of the second transistor device.

12. The circuit of claim 11 wherein a drain of the first transistor device is connected to the drain terminal of the switching circuit and a source of the second transistor device is connected to the source terminal of the switching circuit.

13. The circuit of claim 1, wherein the output circuit comprises two transistor devices, wherein the one or more outputs of the sampling circuit comprise one output, and wherein the one output is coupled to the gate terminal and the bulk terminal of each of the two transistor devices.

14. The circuit of claim 1, wherein the output circuit comprises one transistor device, wherein the one or more outputs of the sampling circuit comprise one output, and wherein the one output is coupled to the gate terminal and the bulk terminal of the one transistor device.

* * * * *